United States Patent [19]

Valentijn

[11] 4,253,417
[45] Mar. 3, 1981

[54] CLOSURE FOR THERMAL REACTOR

[75] Inventor: Johan A. Valentijn, Orange, Calif.

[73] Assignee: Thermco Products Corporation, Orange, Calif.

[21] Appl. No.: 123,243

[22] Filed: Feb. 21, 1980

[51] Int. Cl.³ .............................................. C23C 13/08
[52] U.S. Cl. ..................................... 118/733; 34/242; 118/724; 118/728
[58] Field of Search ............... 118/715, 719, 728, 733; 34/242; 432/242

[56] References Cited

U.S. PATENT DOCUMENTS

| 3,554,162 | 1/1971 | Cota et al. | 118/715 |
| 3,658,032 | 4/1972 | Kohler et al. | 118/715 X |
| 4,018,184 | 4/1977 | Nagasawa et al. | 118/715 |
| 4,116,161 | 9/1978 | Steube | 118/715 |
| 4,154,192 | 5/1979 | Tsubouchi et al. | 118/715 |
| 4,167,915 | 9/1979 | Toole et al. | 118/724 X |

FOREIGN PATENT DOCUMENTS 52-154360  12/1977  Japan .

OTHER PUBLICATIONS

*Japan Jo. of Applied Physics*, vol. 16, No. 5 (1977), Tsubouchi et al., "Oxidation of Silicon in High Pressure Steam", pp. 855–856.

*Japan Jo. of Applied Physics*, vol. 16, No. 6 (1977), Tsubouchi et al., "High Pressure Steam Apparatus for Oxidation of Silicon", pp. 1055–1056.

*Solid State Technology*, vol. 22, No. 7, Jul. 1979, Zeto et al., "Pressure Oxidation of Silicon: An Emerging Technology", pp. 62–69.

*Primary Examiner*—Morris Kaplan
*Attorney, Agent, or Firm*—George R. Clark; Neil M. Rose; Allen J. Hoover

[57] ABSTRACT

Apparatus for thermal oxidation of silicon wafers at high pressures of a type wherein a reactor of a refractory material is disposed within a pressure vessel, and wherein a margin of a wafer portal of the reactor and a closure of the refractory material have congruent surfaces enabling a hermetic seal to be effected, an improvement is disclosed wherein the closure is mounted within a pressure-vessel head used to close an access portal of the pressure vessel by means of gimbals, whereby a hermetic seal can be effected at said surfaces despite misalignments.

14 Claims, 16 Drawing Figures

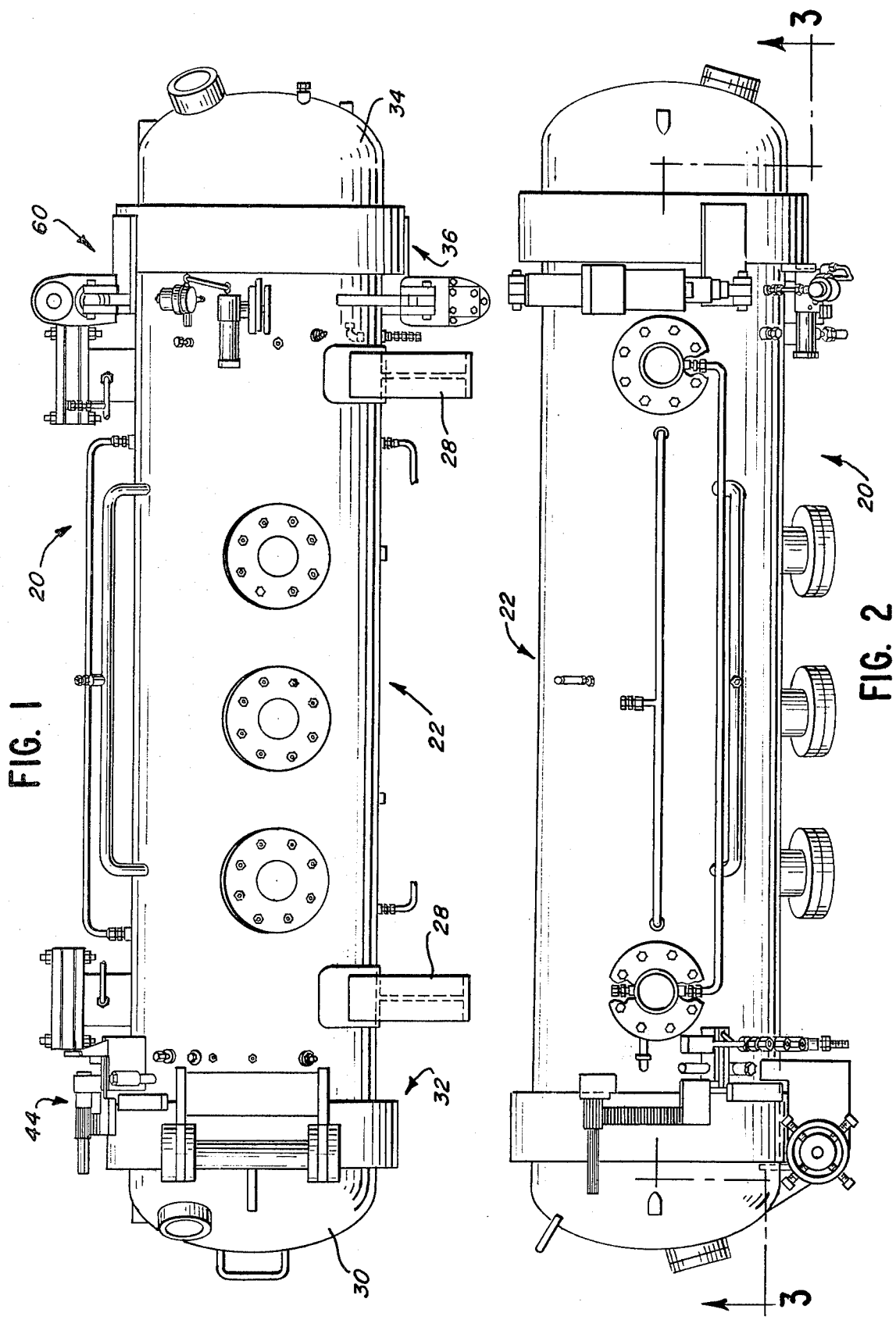

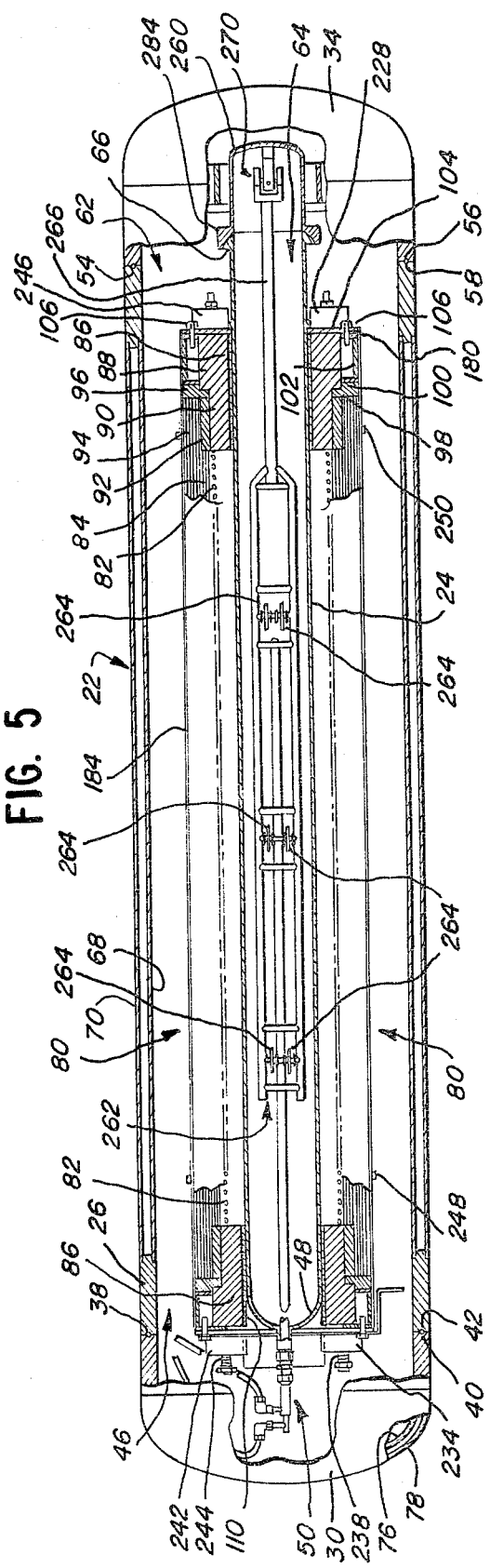
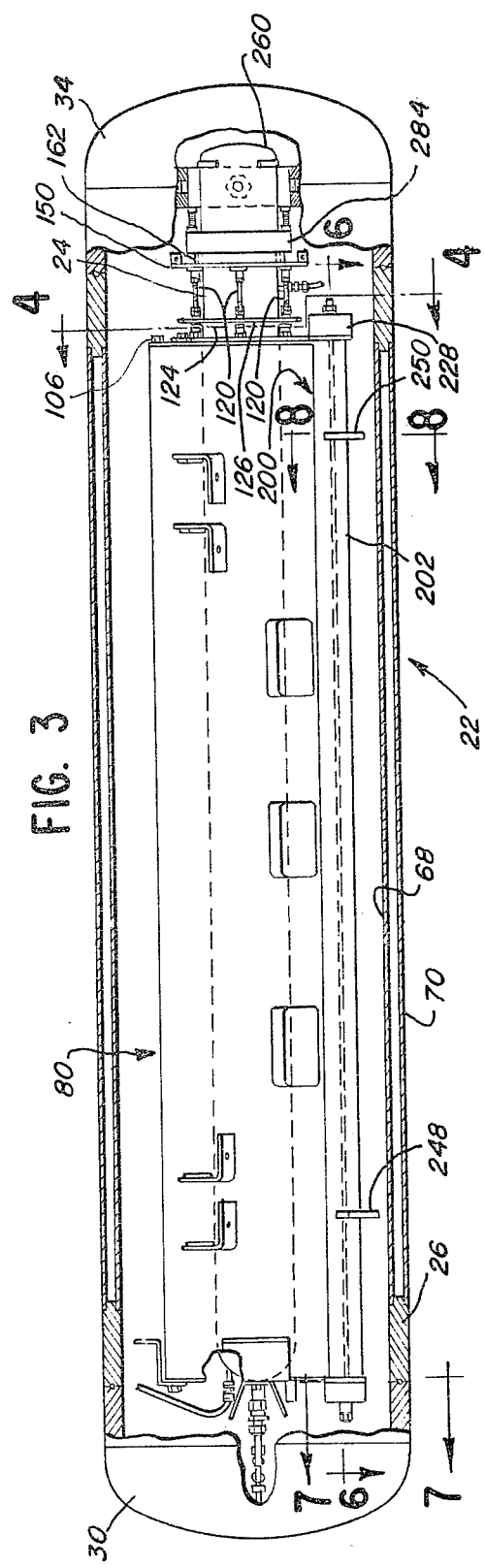

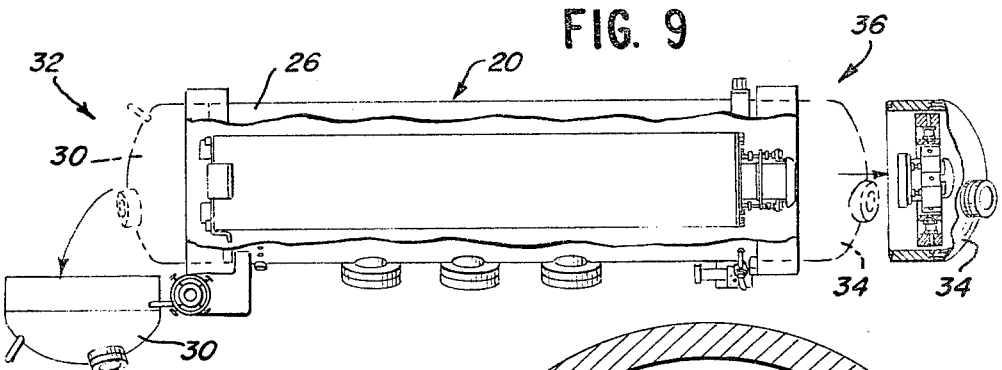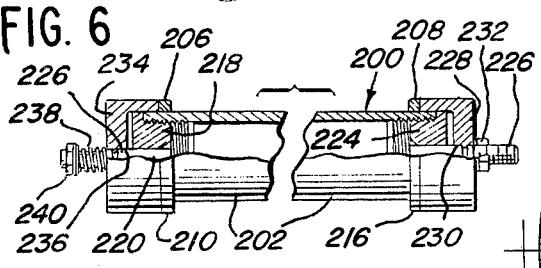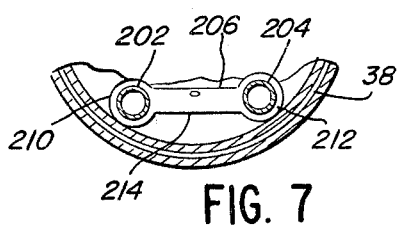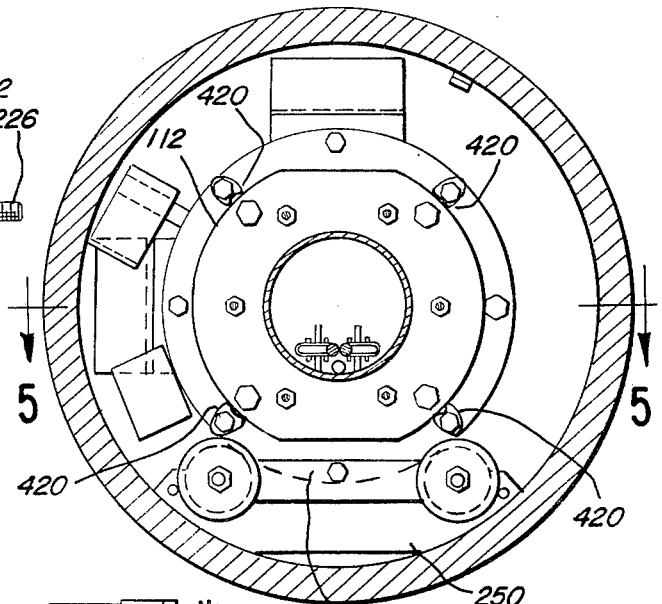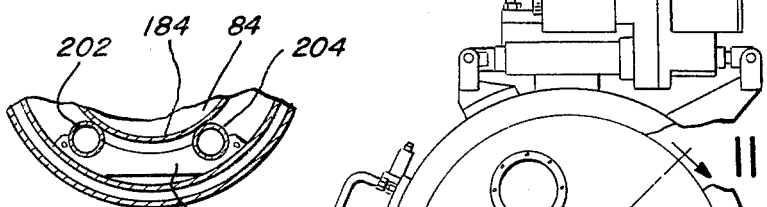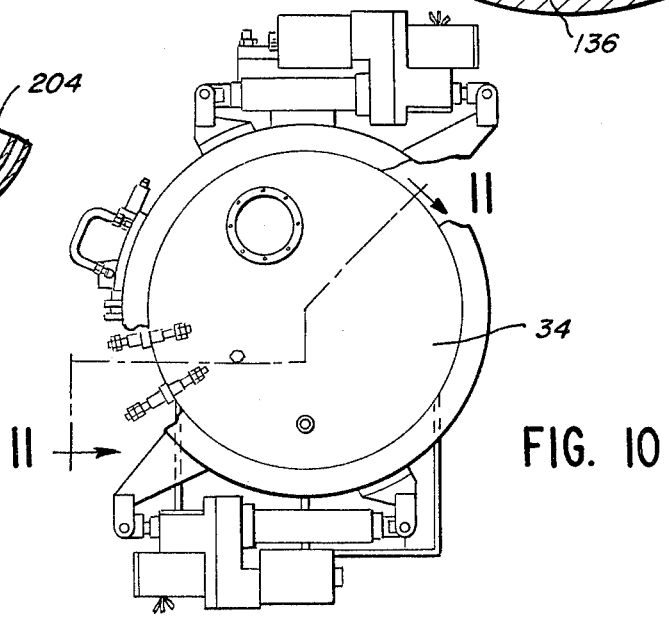

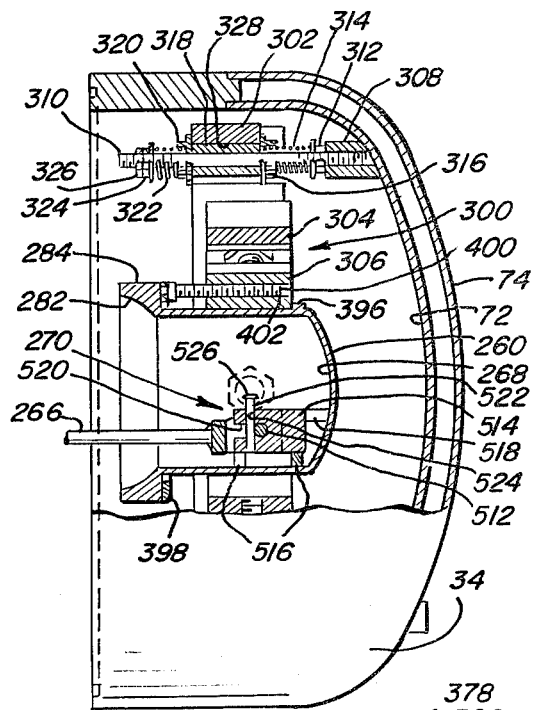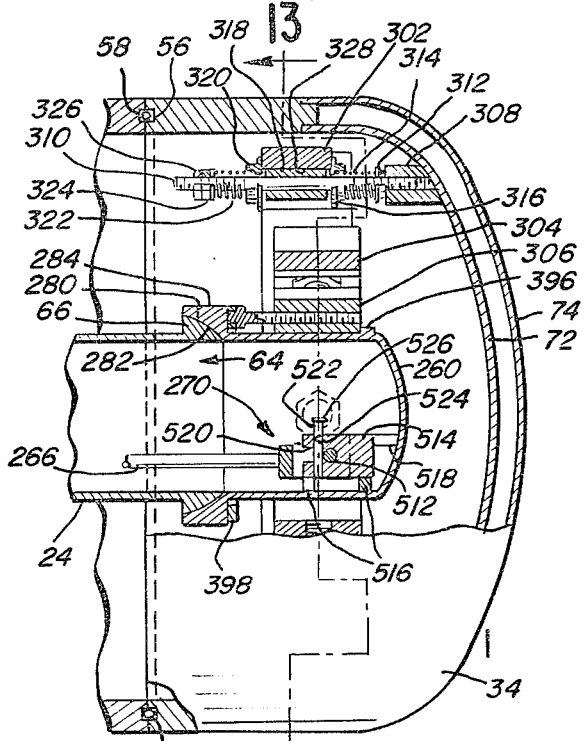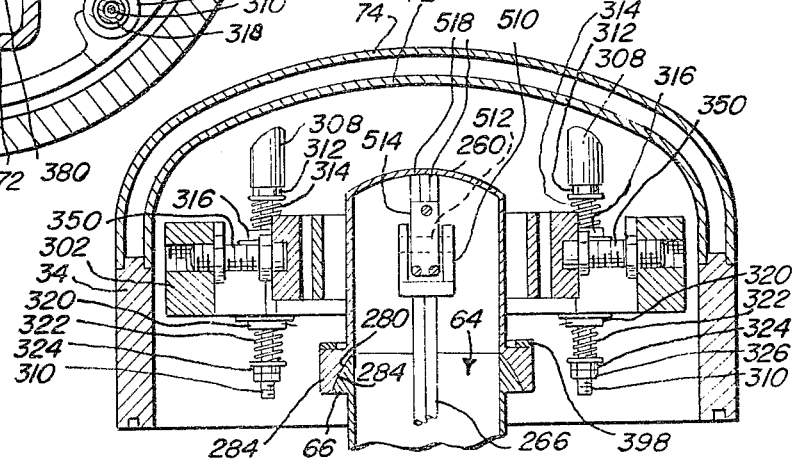

CLOSURE FOR THERMAL REACTOR

BACKGROUND OF THE INVENTION

This invention pertains generally to an apparatus comprising a reactor for thermal oxidation of silicon wafers at high temperatures and high pressures, in controlled atmospheres, and for other processes of thermal treatment requiring silicon wafers or other work pieces to be held under such conditions. This invention pertains particularly to improvements relating to the reactor and a closure for the reactor.

Thermal oxidation of silicon wafers at high temperatures and high pressures, in controlled atmospheres, is discussed in R. J. Zeto, N. O. Korolkoff, and S. Marshall, "Pressure Oxidation of Silicon: An Emerging Technology", *Solid State Technology*, Vol. 22, No. 7, pp. 62–69, July 1979. As discussed therein, such oxidation may be practiced in an atmosphere of steam, which may be formed by pyrogenic reaction of hydrogen and oxygen.

Various apparatus, which may be used for thermal oxidation of silicon wafers at high temperatures and high pressures in a controlled atmosphere of steam, are disclosed in Japanese (Laid-Open) Patent Application No. 1975-114,179 of Mitsubishi Denki Kabushiki Kaisha; Japanese (Laid-Open) Patent Application No. 1977-154,360 of Tel-Thermco Engineering Co., Ltd.; U.S. Pat. No. 4,018,184 of Mitsubishi Denki Kabushiki Kaisha; U.S. Pat. No. 4,154,192 of Mitsubishi Denki Kabushiki Kaisha; U.S. Pat. No. 4,167,915 of Atomel Corporation; N. Tsuboushi, H. Miyoshi, A. Nishimoto, and H. Abe, "Oxidation of Silicon In High-Pressure Steam", Japan J. Appl. Phys., Vol. 16, No. 5, pp. 855–856, 1977; and N. Tsubouchi, H. Miyoshi, A. Nishimoto, H. Abe, and R. Satoh, "High Pressure Steam Apparatus for Oxidation of Silicon", *Japan J. Appl. Phys.*, Vol. 16, No. 6, pp. 1055–1056, 1977.

Such apparatus are characterized by a reactor, which is made of quartz, silicon carbide, or other refractory material of high purity and mechanical strength, and of chemical compatibility, and which is adapted to receive silicon wafers to be oxidized, and a pressure vessel, within which the reactor is disposed. A heating means is disposed within the pressure vessel, near but outside the reactor so as to heat contents of the reactor, but so as to be isolated by the reactor from silicon wafers within the reactor.

Thermal oxidation of silicon wafers may be practiced in such apparatus at high pressures, typically 10 to 25 atmospheres, or higher pressures. One atmosphere is defined by R. J. Zeto et al., op. cit., as follows:

$$1 \text{atm} = 1.0332 \text{ kg (force)}/\text{cm}^2.$$

In such apparatus, the pressure within the reactor and the pressure within the pressure vessel are equalized so as to prevent excessive stress tending to rupture the reactor, as the refractory material of the reactor cannot withstand a large differential between its internal and external pressures. It is known for a small differential, typically about 0.2 atm as computed from internal pressure less external pressure, to be maintained so as to prevent leakage of contaminants into the reactor.

As exemplified in U.S. Pat. No. 4,018,184, such apparatus are known of a type wherein a closure for a workpiece portal, through which silicon wafers are inserted and removed, is made of the same material and biased so as to be pressed against the reactor when attached to the reactor, and so as to allow excessive pressure within the reactor to be relieved through the workpiece portal, and wherein a surrounding margin of the workpiece portal and an adjoining margin of the closure are provided with congruent sealing surfaces enabling a hermetic seal to be effected without an intermediate gasket. It is known for the sealing surfaces to be conical as exemplified in U.S. Pat. No. 4,018,184, spherical, or planar. It also is known for the closure to be mounted within a pressure-vessel head, which is used to seal an access portal of the pressure vessel, so as to enable the closure and the pressure-vessel head to be attached and detached as a subassembly.

In prior apparatus of the type described in the preceding paragraph, precise tolerances must be maintained in the manufacture, assembly, and operation of the apparatus so as to facilitate effective attachment of the closure upon attachment of the pressure-vessel head, and so as to minimize misalignments tending to prevent effective provision of a hermetic seal between the reactor and the closure and tending to cause fragile components to fracture. Particularly, the reactor tends to fracture, if curved sealing surfaces of the reactor and the closure are misaligned so as to impart a bending moment on the reactor when the closure is attached. A major cause of misalignments is a lack of dimensional control in the manufacture of cast refractory members, between which the heating means may be supported, and by which the reactor may be supported. Furthermore, in such apparatus, misalignments can be aggravated by thermal expansion of various components of dissimilar materials.

Accordingly, this invention is addressed to the need, in prior apparatus of said type, for improvements enabling a hermetic seal to be effected despite misalignments between the reactor and the closure and reducing tendencies of fragile components to fracture.

SUMMARY OF THE INVENTION

This invention may be embodied in an apparatus for thermal treatment of silicon wafers or other workpieces at high temperatures and high pressures, in controlled atmospheres, of a type comprising a reactor, which is made of quartz, silicon carbide, or other refractory material, which is adapted to hold silicon wafers, and which has a workpiece portal for insertion and removal of silicon wafers, and a pressure vessel, in which the reactor is disposed, and which has an access portal for access to the workpiece portal.

The apparatus comprises a closure, which is made of the same material, and which is adapted to be attached to the reactor so as to close the workpiece portal and to be detached from the reactor for insertion and removal of silicon wafers through the workpiece portal. A surrounding margin of the workpiece portal and an adjoining margin of the closure respectively have congruent sealing surfaces enabling a hermetic seal to be effected when the closure is attached to the reactor so as to effect mutual engagement of said surfaces. The apparatus comprises means for biasing the closure so as to press the sealing surfaces against each other when the closure is attached to the reactor, and so as to enable excess pressure within the reactor to be relieved through the workpiece portal.

The apparatus comprises a pressure-vessel head, which is adapted to be attached to the pressure vessel so as to close the access portal and to be detached from the pressure vessel for access to the workpiece portal through the access portal. The closure is mounted within the pressure-vessel head so as to enable the closure and the pressure-vessel head to be attached and detached as a subassembly.

As improved by this invention, the apparatus comprises gimbals mounting the closure within the pressure-vessel head whereby a hermetic seal can be effected by mutual engagement of the sealing surfaces despite misalignments between the reactor and the closure.

The gimbals may comprise an outer ring, means for mounting the outer ring within the pressure-vessel head for translational movement toward and away from the reactor when the pressure-vessel head is attached, a middle ring, means for mounting the middle ring to the outer ring for pivotal movement about a first axis, an inner ring, which is fixed to the closure, and means for mounting the inner ring to the middle ring for pivotal movement about a second axis, which is orthogonal to the first axis.

The gimbals are supported by a plurality of parallel studs extending inwardly from the pressure-vessel head and cooperating with the outer ring so as to guide the outer ring as the outer ring moves toward and away from the reactor when the pressure-vessel head is attached.

The biasing means may comprise a pair of coiled springs piloted in approximate end-to-end relation to each other on each rod, the outer ring being interposed between the nearer ends of the springs piloted on each rod, the farther ends of the springs being blocked so as to bias the outer ring to a neutral position wherein each spring is somewhat compressed when the closure and the pressure cap are detached, whereupon mutual engagement of the sealing surfaces of the surrounding margin of the workpiece portal and the adjoining margin of the closure when the closure and the pressure-vessel head are attached displaces the outer ring from the neutral position and causes one of each pair of the springs to be further compressed so as to press the sealing surfaces against each other.

Furthermore, the means for mounting the middle ring to the outer ring may enable the middle ring to be adjusted manually to a selected position along the first axis, and the means for mounting the inner ring to the middle ring may enable the inner ring to be adjusted manually to a selected position along the second axis.

One of the sealing surfaces may be convex, preferably the sealing surface of the surrounding margin of the workpiece portal, and the other may be concave, preferably the sealing surface of the adjoining margin of the closure. Both sealing surfaces may be spherical.

Hence, the gimbals correct automatically for misalignments due to lack of parallelism between the sealing surface of the surrounding margin of the wafer portal and the sealing surface of the adjoining margin of the closure, whereupon parallelism between said sealing surfaces is achieved.

If both sealing surfaces are spherical, or otherwise suitably shaped, the gimbals also correct automatically for misalignments due to minor vertical and lateral displacements of the closure from a position of mutual alignment of the sealing surfaces.

If the middle ring is adjustable to a selected position along the first axis, and if the inner ring is adjustable to a selected position along the second axis, misalignments due to major vertical and lateral displacements of the closure along these axes from the position of mutual alignment of the sealing surfaces may be corrected manually by suitable adjustment of the adjustable rings. However, if both sealing surfaces are spherical, or otherwise suitably shaped, as discussed in the preceding paragraph, precise adjustments of the adjustable rings along the respective axes are not required, as the gimbals correct automatically for misalignments due to minor vertical and lateral displacements of the closure from the position of mutual alignment of the sealing surfaces.

Furthermore, the apparatus may comprise means suspending the reactor within the pressure vessel, at a portion of the reactor near the workpiece portal so as to relieve mechanical stresses on the reactor, and so as to allow thermal expansion of the reactor and thermal contraction of the reactor. Thus, tendencies of fragile components to fracture are reduced, particularly, if a bending moment is imposed on the reactor.

It is to be understood that the foregoing features are intended to be effective for misalignments due to maximum vertical or lateral displacements of about 8.25 mm, or 0.325 in., as may be encountered despite good engineering practices.

These and other objects, features, and advantages of this invention will be evident from the following description of a preferred embodiment of this invention.

BRIEF DESCRIPTION OF THE DRAWINGS

FIG. 1 is a front, elevational view of an apparatus, in which this invention has been embodied, for thermal oxidation of silicon wafers.

FIG. 2 is a top, plan view of said apparatus.

FIG. 3 is a longitudinal, sectional view taken along line 3—3 of FIG. 2 in the direction of the arrows, opposite pressure-vessel heads on a pressure vessel of said apparatus being shown as partially broken away, and certain components within the pressure vessel not being sectioned.

FIG. 4 is a transverse, sectional view taken along line 4—4 of FIG. 3.

FIG. 5 is a longitudinal sectional view taken along line 5—5 of FIG. 4.

In FIGS. 3 and 5, external details of the pressure vessel are omitted for clarity. FIG. 4 is drawn on an enlarged scale.

FIG. 6 is an enlarged view, partially in longitudinal section, of certain details of FIG. 3.

FIG. 7 is a fragmentary, sectional view taken along line 7—7 of FIG. 3 in the direction of the arrows.

FIG. 8 is a fragmentary, sectional view taken along line 8—8 of FIG. 3.

FIG. 9 is a top, exploded view of said apparatus on a smaller scale, as partially cut-away. In FIG. 9 opposite pressure-vessel heads appear in opened positions in full lines and in closed positions in phantom lines, and some details are omitted for clarity.

FIG. 10 is an end, elevational view of one end of said apparatus.

FIG. 11 is a transverse, sectional view taken along line 11—11 of FIG. 10 in the direction of the arrows so as to show a pressure-vessel head and a closure as attached to said apparatus, other parts of which are fragmentarily shown.

FIG. 12 is a similar view of the pressure-vessel head and the closure as detached from the apparatus.

FIG. 13 is a transverse, sectional view along line 13—13 of FIG. 11 in the direction of the arrows.

FIG. 14 is a transverse, sectional view taken along line 14—14 of FIG. 13 in the direction of the arrows.

FIG. 16 is a similar view of the reactor and the closure, as shown in FIG. 11, in an alternative embodiment. In FIG. 16, other parts are omitted for clarity, and primed reference numbers designate parts similar, except as described, to parts designated by unprimed reference numbers in the preferred embodiment of FIGS. 1 through 15.

DETAILED DESCRIPTION OF PREFERRED EMBODIMENT

Figure 15:
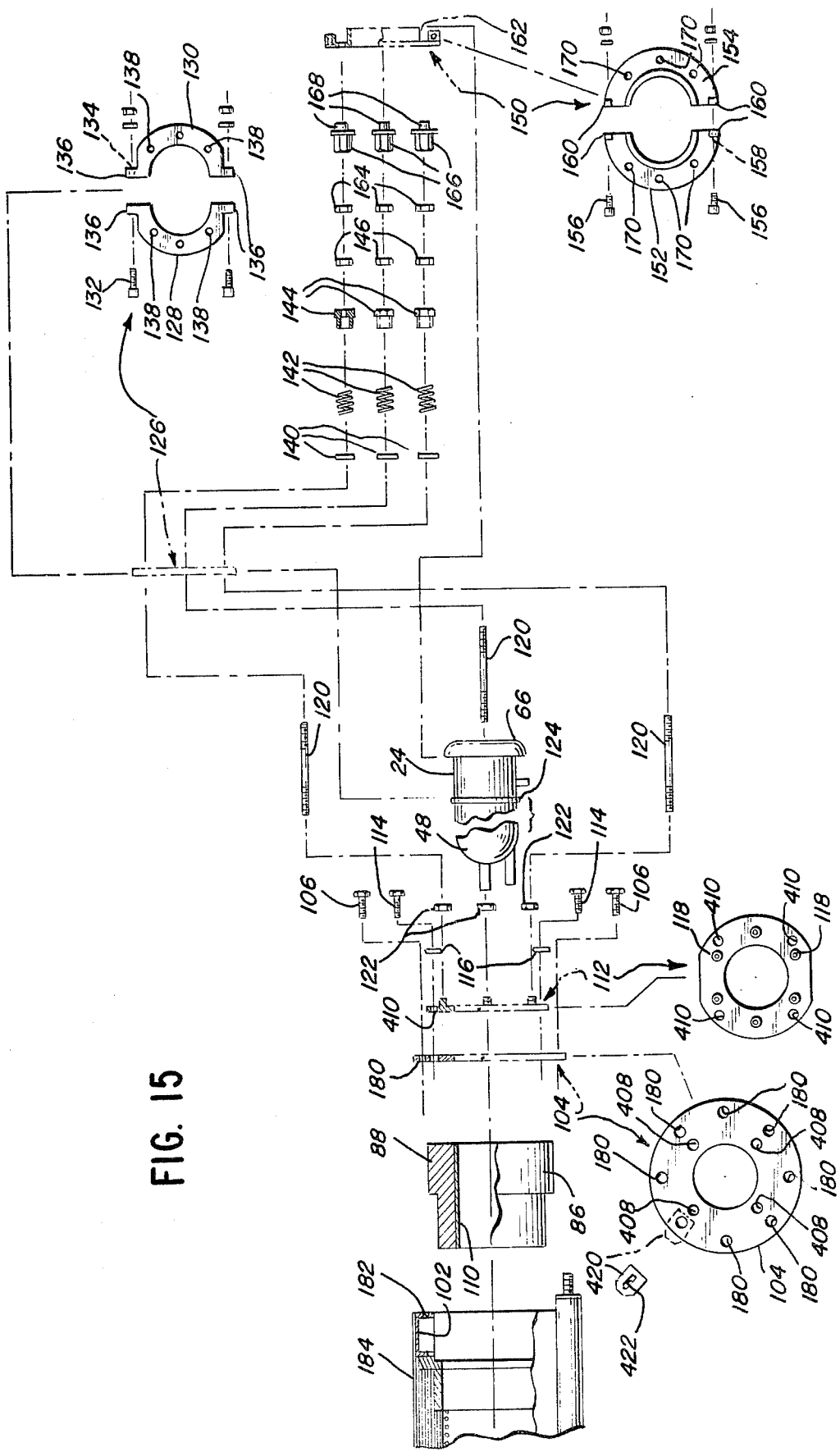
FIG. 15 is an enlarged, exploded view of certain components, essentially as seen in FIG. 3, but wherein certain components have been rotated 90° so as to illustrate certain details.

In the drawings, an apparatus 20 for thermal oxidation of silicon wafers at high temperatures and high pressures, in controlled atmospheres, is shown. The apparatus 20 may be used not only for such oxidation but also for nitriding, annealing, and other processes requiring silicon wafers or other workpieces to be held under such conditions. Such oxidation may be practiced in an atmosphere of steam, which may be formed by pyrogenic reaction of hydrogen and oxygen, and to which other gases may be added.

The apparatus 20 comprises a pressure vessel 22, which is elongated, tubular, and designed to withstand high pressures, typically 10 to 25 atmospheres, as employed in such processes, and a reactor 24, which is disposed within the pressure vessel 22. The reactor 24 is elongated tubular, and made of quartz, silicon carbide, or other refractory material of high purity and mechanical strength, and of chemical compatibility. For thermal oxidation of silicon wafers, quartz is preferred.

The pressure vessel 22 comprises a tubular shell 26, which is supported on a suitable foundation (not shown) by means of saddles 28 supporting the tubular shell 26 from beneath, a pressure-vessel head 30, which is hinged to the tubular shell 26 at a "source" end 32 of the pressure vessel 22, and a pressure-vessel head 34, which is attachable to and detachable from the tubular shell 26 at a "load" end 36 of the pressure vessel 22. [Herein, the "source" end shall refer to the left end of the apparatus 20 and its components as shown in FIGS. 1 through 5, and the "load" end shall refer to the right end of the apparatus 20 and its components as shown in FIGS. 1 through 5.]

The pressure-vessel head 30 may be pivoted between a closed position, wherein it is shown in phantom lines in FIG. 9, and an opened position, wherein it is shown in full lines in FIG. 9. An O-ring 38 is seated in a groove 40 in the pressure-vessel head 30 and a groove 42 in the tubular shell 26 when the pressure-vessel head 30 is closed, as shown in FIG. 3 and FIG. 5, so as to enable a pressure seal to be effected therebetween. Conventional means 44 (of a manually actuatable type used in a Harris door as used in conventional pressure vessels for many years) are used to secure the pressure-vessel head 30 in its closed position. The pressure cap 30 may be pivoted to its opened position so as to open an access portal 46, which is bounded by the tubular shell 26, for access to the reactor 24 at a closed end 48 of the reactor 24 and to internal fittings 50 for process gases.

The pressure-vessel head 34 may be attached to the tubular shell 26, as shown in phantom lines in FIG. 9, and may be detached from the tubular shell 26, as shown in full lines in FIG. 9. An O-ring 54 is seated in a groove 56 in the pressure-vessel head 34 and a groove 58 in the tubular shell 26 when the pressure-vessel head 34 is attached to the tubular shell 26, as shown in FIGS. 3, 5, and 11, so as to enable a pressure seal to be effected therebetween. Conventional means 60 (of an automatically actuatable type used in a Harris door as mentioned above) are used to secure the pressure-vessel head 34 when the pressure-vessel head 34 is attached to the tubular shell 26. The pressure-vessel head 34 may be detached so as to open an access portal 62, which is bounded by the tubular shell 26, for access to the reactor 24 at a workpiece portal 64 bounded by its nearer end 66, which is enlarged as shown.

As noted in FIGS. 3 and FIG. 5, a substantial portion of the tubular shell 26 has an inner wall 68 and an outer wall 70, between which a cooling fluid is circulated. As noted in FIGS. 11, 12, and 14, a substantial portion of the pressure-vessel head 34 has an inner wall 72 and an outer wall 74, between which a cooling fluid is circulated. As noted fragmentarily in FIG. 5, a substantial portion of the pressure-vessel head 30 has an inner wall 76 and an outer wall 78 between which a cooling fluid is circulated. In each case, the cooling fluid may be water.

The reactor 24 is supported within and extends at its enlarged end 66 from a tubular assembly 80, which serves as a heating chamber. The tubular assembly 80 comprises an elongated, helical, electric heating coil 82, which is wrapped so as to be confined by numerous layers 84 of refractory fiber felt applied around the heating coil 82 in strips or sheets, as available from Johns-Manville Corp., P. O. Box 5108, Denver, Colo. 80217, under its trademark "Cerafelt".

At each end, the tubular assembly 80 also comprises a tubular sleeve 86, which is made of cast refractory material so as to serve as a vestibule block minimizing heat loss from the tubular assembly 80, and which has a portion 88 of larger outer diameter and a portion 90 of smaller outer diameter, a smaller sleeve 92, which is made of similar refractory material, and which is disposed around the portion 90 of smaller outer diameter, additional layers 94 of "Cerafelt" refractory fiber felt, which extend beyond the layers 84, and which are applied around the layers 84 and the smaller sleeve 92 in sheets, an annular spacer 96, which is made of similar refractory material, which is disposed around the tubular sleeve 86, against the smaller sleeve 92, and against the layers 94, and which has a portion 98 of smaller inner diameter fitting around the portion 90 of smaller outer diameter and a portion 100 of larger inner diameter fitting around the portion 88 of larger outer diameter, an annular channel 102, which is disposed (so as to open radially inwardly) around the portion 88 of larger outer diameter, and an annular plate 104, which is disposed against the tubular sleeve 86 and the annular channel 102, and which is fastened to the annular channel 102 by threaded fasteners 106 passing through respective openings 180 in the annular plate 104, into threaded sockets 182 in the annular channel 102. The tubular assembly 80 is wrapped by an outermost layer 184 of sheet aluminum riveted to the annular channel 102.

As mentioned hereinbefore, a major cause of misalignments is a lack of dimensional control in the manufacture of cast refractory elements, as exemplified by the tubular sleeves 86, the smaller sleeves 92, and the annular spacers 96, which may be made from castable refractory material available from Johns-Manville Corp., supra, under its trademark "Marinite".

The tubular assembly 80 rests on a cradle 200 within the pressure vessel 22. As shown in FIGS. 3 through 8, the cradle 200 comprises a pair of elongated tubes 202, 204, which are spaced from each other by a pair of lateral brackets 206, 208, near opposite ends of the tubes 202, 204. As shown in FIG. 7, the bracket 206 has opposite annular portions 210, 212, through which the tubes 202, 204 pass, and which are joined by a transverse portion 214. The bracket 208 is similar, one annular portion 216 appearing in FIG. 6.

As shown in FIG. 6, a threaded plug 218 carrying a threaded stud 220 welded thereto is threaded into the "source" end of the tube 202, and a threaded plug 224 carrying a threaded stud 226 welded thereto is threaded into the "load" end of the tube 202. A cap 228 having an opening 230, through which the threaded stud 226 extends, is fitted over the "load" end of the tube 202, so as to abut the annular portion 216 of the bracket 208. A threaded nut 232 is threaded onto the threaded stud 226 so as to lock the cap 228 onto the tube 202. A cap 234 having an opening 236, through which the threaded stud 220 extends, is fitted over the "source" end of the tube 202 so as to abut the annular portion 210 of the bracket 206. A spring 238 is piloted over the threaded stud 220 outside the cap 234. A cap nut 240 is threaded onto the threaded stud 220 so as to abut the spring 238. As shown partially in FIG. 5, the tube 204 has a similar arrangement, a cap 242 and a spring 244 being associated similarly with its "source" end, and a cap 246 being associated with its "load" end where there is no spring.

The tubes 202, 204, also are spaced by a pair of lateral yokes 248, 250, which support the tubes 202, 204, and which are disposed between the brackets 206, 208. The yoke 250, which is nearer to the "load" end is welded to the tubes 202, 204, which are free to move with respect to the yoke 248. The yokes 248, 250, are shaped similarly so as to conform to the inner wall 68 of the tubular shell 26 of the pressure vessel 22. The yokes 248, 250 are welded to the inner wall 68.

The tubular assembly 80, which supports the reactor 24, is rested on the tubes 202, 204, between the brackets 206, 208. The springs 238, 244, bias the bracket 206 against the tubular assembly 80 but allow for thermal expansion of the tubular assembly 80. The bracket 208 is welded to the caps 228, 246.

The apparatus 20 also comprises a closure 260, which is made of the refractory material of the reactor 24, preferably quartz. The closure 260 is adapted to be attached to the reactor 24 so as to close the wafer portal 64. The closure 260 is adapted to be detached from the reactor 24 for insertion and removal of silicon wafers through the wafer portal 64.

Silicon wafers are inserted into the reactor 24, held in the reactor 24, and removed from the reactor 24 by means of a paddle 262, which has wheels 264, and which has an elongated handle 266 extending through the workpiece portal 64 and being attached removably to an inner surface 268 of the closure 260 by means of fittings 270 made of the refractory material of the reactor 24 and the closure 260.

The fittings 270, by which the handle 266 is attached to the inner surface 268 of the closure 260, comprise a fork 510, which is fused to the handle 266, a cross-pin 512, which extends across and is fused to the fork 510, a block 514, which is mounted within the closure 260 by three cylindrical feet 516 fused beneath and to the block 514 and to the closure 260 and by two cylindrical rods 518 fused behind and to the block 514 and to the closure 260, and which has a lateral slot 520 opening toward the handle 266 and receiving the cross-pin 512, and a lock-pin 522 which fits removably into vertically aligned openings 524 in the block 514 so as to lock the cross-pin 512 in the lateral slot 520. The lock-pin 522, which is enlarged at its upper end 526 so as to limit its downward travel, may be removed so as to enable the handle 266 to be detached from the closure 260.

The paddle 262 is designed to hold boats (not shown) holding silicon wafers (not shown) and being made of compatible refractory material. The paddle 262 is inserted into the reactor 24 as the closure 260 is attached to the reactor 24 and withdrawn from the reactor 24 as the closure 260 is detached from the reactor 24.

A surrounding margin 280 of the workpiece portal 64 of the reactor 24 and an adjoining margin 282 on an enlarged end 284 of the closure 260 are provided with congruent sealing surfaces, which are spherical as shown so as to resemble a ball joint when pressed together, and which enable a hermetic seal to be effected without an intermediate gasket. The closure 260 is biased so as to be pressed against the reactor 24 when the closure 260 is attached, and so as to enable excess pressure within the reactor 24 to be relieved through the workpiece portal 64. The closure 260 is mounted within the pressure-vessel head 34 so as to enable the closure 260 and the pressure-vessel head 34 to be attached and detached as a subassembly.

The apparatus 20 is provided with means for pressurizing the reactor 24 with a controlled atmosphere, which may be steam formed by pyrogenic reaction of hydrogen and oxygen, and with means for pressurizing the pressure vessel 22 outside the reactor 24 with an inert gas, which may be nitrogen, so as to equalize the internal and external pressures of the reactor 24. A small differential, which may be about 0.2 atm as computed from internal pressure less external pressure, may be maintained so as to prevent leakage of contaminants into the reactor 24. The apparatus 20 also is provided with means for energizing the heating coil 82 so as to heat contents of the reactor 24 under controlled conditions of high temperatures. Pertinent details of the pressurizing and heating means are omitted herein, as unnecessary to the comprehension of this invention, which pertains to improvements relating to the reactor 24 and the closure 260.

As described so far, the apparatus 20 is similar to prior apparatus for thermal treatment of silicon wafers in controlled atmospheres at high temperatures and high pressures, of the type improved by this invention. Such apparatus have been sold by Thermco Products Corporation, P. O. Box 1875, 1465 North Batavia Street, Orange, Calif. 92668.

As shown in FIGS. 3, 4, and 15, this invention contemplates that the reactor 24 is suspended from the tubular assembly 80. Each tubular sleeve 86 has a liner 110, which may be made of "Cerafelt" refractory fiber felt, and through which the reactor 24 is inserted loosely. At the "load" end, an annular plate 112 is fastened to the annular plate 104 by threaded fasteners 114 passing through respective washers 116, through unthreaded openings 410 in the annular plate 112, into threaded openings 408 in the annular plate 104. The annular plate 112 has threaded sockets 118 receiving respective threaded studs 120 locked thereon by respective threaded nuts 122. The openings 410 are oversized so as to permit slight vertical and lateral adjustment of relative positions of the annular plate 104 and the annular plate 112. As shown in FIG. 4, the annular plate 112 is secured radially by position adjusters 420, which have radial slots 422, and one of which is shown in FIG. 15. Alternate ones of the fasteners 106 pass through the adjusters 420, which radially clamp the annular plate 112 at four locations, and which are fixed by the fasteners 106 passing therethrough.

The reactor 24 is formed integrally with a circumferential rib 124 near its enlarged end 66 defining the wafer portal 64. An annular plate 126 is made in two separate pieces 128, 130, which are assembled by threaded fasteners 132, passing through openings 134 in flanges 136 thereon. The annular plate 126 is mounted around the reactor 24, between the circumferential rib 124 and the enlarged end 66 of the reactor, and against the circumferential rib 124. The threaded studs 120 pass through respective openings 138 in the annular plate 126, and through respective washers 140, coiled springs 142, spring retainers 144, and threaded nuts 146. The retainers 144 are flanged so as to retain the springs 142.

An annular plate 150 is made in two separate pieces 152, 154, which are assembled by threaded fasteners 156 passing through openings 158 in flanges 160 thereon. As assembled, the annular plate 150 has a tubular flange 162, which fits around the reactor against its enlarged end 66 so as to support the reactor. The threaded studs 120 pass through threaded nuts 164 and through threaded retaining elements 166, which have respective unthreaded extensions 168 passing through respective openings 170 in the annular plate 150, as shown in FIG. 15. When the nuts 146 are threaded (to the left as shown in FIG. 15) against the spring retainers 144, which retain the springs 142, and when the nuts 164 are threaded (to the right as shown in FIG. 15) against the threaded retaining elements 166, the reactor 24 is suspended within the tubular assembly 80, permitted limited radial movement within the tubular assembly 80, permitted limited longitudinal movement within the tubular assembly 80, and biased toward the access portal 62 by the springs 142. Thus, mechanical stresses on the reactor 24 are imparted through the studs 120 to the tubular assembly 80, so as to be relieved in substantial part.

As improved by this invention, the apparatus 20 comprises gimbals 300 mounting the closure 260 within the pressure-vessel head 34, whereby a hermetic seal can be effected by mutual engagement of the sealing surface of the surrounding margin 280 of the workpiece portal 64 of the reactor 24 and the sealing surface of the adjoining margin 282 of the closure 260 despite misalignments between the reactor 24 and the closure 260. The gimbals 300 correct automatically for misalignment due to lack of parallelism between said sealing surfaces. Also, as both sealing surfaces are spherical, the gimbals 300 correct automatically for misalignments due to minor vertical and lateral displacements of the closure 260 from a position of mutual alignment of the sealing surfaces.

As shown in FIGS. 11 through 14, the gimbals 300 comprise an outer ring 302, which is mounted within the pressure-vessel head 34 for translational movement toward and away from the reactor 24 when the pressure-vessel head 34 is attached, and which is biased toward the reactor 24 when the pressure-vessel head 34 is attached, a middle ring 304, which is mounted to the outer ring 302 for pivotal movement about a first axis, and an inner ring 306, which is fixed to the closure 260, and which is mounted to the middle ring 304 for pivotal movement about a second axis. The second axis is orthogonal to the first axis. As shown in FIG. 13, the first axis is horizontal, the second axis is vertical, and the first and second axes are coplanar.

The outer ring 302 is mounted within the pressure-vessel head 34 by means of four threaded sockets 308, which are attached to the inner wall 72 of the pressure-vessel head 34 and four threaded studs 310, which are threaded respectively into the respective sockets 308 so as to extend inwardly from the pressure-vessel head 34, and which are secured therein by a threaded nut 312 on each stud 310. On each stud 310, which has an unthreaded portion between its threaded ends, a coiled spring 314 is piloted on such stud 310 so as to bear against the nut 312 thereon and against a spring retainer 316 into which one end of the spring 314 extends, and which is carried on such stud 310 with a sliding fit, a sleeve bearing 318, which is carried by the outer ring 302 as described below, is carried on the unthreaded portion of such stud 310 with a sliding fit, another spring retainer 320 is carried on such stud 310 with a sliding fit, and another coiled spring 322 is piloted on such stud 310 so as to bear against the spring retainer 320 and against a threaded nut 324, which is threaded onto such stud 310 and locked thereon by another threaded nut 326. The lower bearings 318 may be omitted for ease of alignment.

The bearings 318 are carried by the outer ring 302 in respective pockets 328, which are formed in the outer ring 302 so as to open radially inwardly in the outer ring 302, as shown in FIG. 13. The spring retainers 316, 320, confine the bearings 318 axially so as to retain the bearings 318 within the pockets 328 and so as to bear against the outer ring 302.

As the ends of the spring 314 farther from the bearings 318 are blocked by the nuts 312, as the ends of the springs 314 nearer to the bearings 318 engage the retainers 316, as the ends of the springs 322 farther from the bearings 318 are blocked by the nuts 324, and as the ends of the springs 322 nearer to the bearings 318 engage the retainers 320, the outer ring 302 is biased to a neutral position wherein the springs 314 and the springs 322 are somewhat compressed when the closure 260 and the pressure-vessel head 34 are detached, as shown in FIG. 12.

The middle ring 304 is mounted to the outer ring 302 by a pair of gimbal-retaining pins 350, which are coaxial with each other, and each of which has a threaded end 352 and an unthreaded end 354. As shown in FIG. 13, the unthreaded end 354 of each pin 350 extends into an unthreaded socket 356 in the middle ring 304 as far as permitted by a nut 358 threaded on such pin 350, the threaded end 352 of such pin 350 is threaded into a threaded socket 360 in the outer ring 302 as far as necessary for proper alignment of the middle ring 304 along the first axis, and such pin 350 is secured by a nut 362 threaded on such pin 350 so as to bear against the outer ring 302. The pins 350 rotate in the sockets 356 so as to permit pivotal movement of the middle ring 304 about the first axis. The threaded ends 352 of the pins 350, the threaded sockets 360, and the nuts 362 enable the middle ring 304 to be adjusted manually to a selected position along the first axis.

The inner ring 306 is mounted to the middle ring 304 by a pair of gimbal-retaining pins 370, which are coaxial with each other, and each of which has a threaded end 372 and an unthreaded end 374. As shown in FIG. 13, the unthreaded end 374 of each pin 370 extends into an unthreaded socket 376 in the middle ring 304 as far as permitted by a nut 378 threaded on such pin 370, the threaded end 372 of such pin 370 is threaded into a threaded socket 380 in the inner ring 306 as far as necessary for proper alignment of the inner ring 306 along the second axis, and such pin 370 is secured by a nut 382 threaded on such pin 370 so as to bear against the inner ring 306. The pins 370 rotate in the sockets 376 so as to permit pivotal movement of the inner ring 306 about the second axis. The threaded ends 372 of the pins 370, the threaded sockets 380, and the nuts 382 enable the inner ring 306 to be adjusted manually to a selected position along the second axis.

As shown in FIG. 13, the inner ring 306 is made in two separate parts, 390, 392, which are assembled by threaded fasteners 394 so as to fit around the closure 260, which has integral circumferential ribs 396 bearing loosely against the inner ring 306. An annular element 398 is disposed around the closure 260, and against its enlarged end 284. Threaded elements 400, which are threaded into threaded bores 402 in the inner ring 306, are adjusted so as to bear against the annular element 398. Thus, the inner ring 306 is fixed on the closure 260 between the integral rib 396 and the annular element 398, which is made of metal. Mechanical stresses are carried by the elements 400.

When the closure 260 and the pressure-vessel head 34 are attached as a subassembly, mutual engagement of the surrounding margin 280 of the workpiece portal 64 and the adjoining margin 282 of the closure 260 displaces the outer ring 302 from the neutral position and causes the springs 314 to be further compressed so as to press the sealing surfaces against each other, whereupon the springs 322 may be completely relaxed. The springs 314, 322, are selected for suitable spring constants so as to eliminate abrupt jarring contact between the sealing surfaces, and so as to provide effective sealing pressure. Excess pressure within the reactor 24 causes the springs 314 to be further compressed, whereby such pressure is relieved through the workpiece portal 64, typically whenever the pressure inside the reactor 24 exceeds the pressure outside the reactor 24 by more than about 0.5 atm.

As discussed above, the middle ring 304 may be adjusted manually to a selected position along the first axis, and the inner ring 306 may be adjusted manually to a selected position along the second axis, whereby misalignments due to major vertical and lateral displacements of the closure 260 from the position of mutual alignment of the sealing surfaces may be corrected manually. [Herein, "vertical" and "lateral" are to be understood from FIG. 13, and the position of mutual alignment of the sealing surfaces is shown in FIG. 11.] Because both sealing surfaces are spherical, precise adjustments of the middle ring 304 and the inner ring 306 along the respective axes are not required, as the gimbals 300 correct automatically for minor vertical and lateral displacements of the closure 260 from the position of mutual alignment of the sealing surfaces.

The alternative embodiment of FIG. 16 has been proposed and is similar to the preferred embodiment of FIGS. 1 through 15, except that the sealing surface of the surrounding margin 280' of the workpiece portal 64' of the reactor 24' is concave, and the sealing surface of the adjoining margin 282' of the closure 260' is convex.

In the alternative embodiment, gimbals (not shown) similar to the gimbals 300 of the preferred embodiment compensate automatically for misalignments due to a lack of parallelism between said sealing surfaces as well as for misalignments due to minor vertical and horizontal displacements of the closure from a position of mutual alignment, wherein the reactor 24' and the closure 260' are shown in FIG. 16.

The sealing surfaces in either aforementioned embodiment must be smoothly ground and highly polished by well known techniques.

Preferably, in either aforementioned embodiment, the workpiece portal of the reactor is circular, as may be inferred from FIGS. 11, 12, etc. However, as in prior apparatus employing congruent sealing surfaces, the sealing surfaces of any aforementioned embodiment eliminate misalignments due to relative rotation of the reactor and the closure, even if the workpiece portal is not circular.

Nonetheless, as mentioned above, it is to be understood that the foregoing features are intended to be effective for misalignments due to maximum vertical or lateral displacements of about 8 mm, or 0.325 in., as may be encountered despite good engineering practices.

I claim:

1. In an apparatus for thermal treatment of silicon wafers or other workpieces at high temperatures and high pressures in controlled atmospheres, of a type comprising
   (a) a reactor, which is made of a refractory material, which is adapted to hold such workpieces, and which has a workpiece portal for insertion and removal of such workpieces,
   (b) a pressure vessel, in which the reactor is disposed, and which has an access portal for access to the workpiece portal,
   (c) a closure, which is made of the same material, and which is adapted to be attached to the reactor so as to close the workpiece to the reactor so as to close the workpiece portal and to be detached from the reactor for insertion and removal of such workpieces through the workpiece portal, a surrounding margin of the workpiece portal and an adjoining margin of the closure respectively having congruent sealing surfaces enabling a hermetic seal to be effected when the closure is attached to the reactor so as to effect mutual engagement of said surfaces,
   (d) means for biasing the closure so as to press said sealing surfaces against each other when the closure is attached to the reactor, and so as to enable excess pressure within the reactor to be relieved through the wafer portal,
   (e) a pressure-vessel head, which is adapted to be attached to the pressure vessel so as to close the access portal and to be detached from the pressure vessel for access to the workpiece portal through the access portal, the closure being mounted within the pressure-vessel head so as to enable the closure and the pressure-vessel head to be attached and detached as subassembly, an improvement wherein the apparatus comprises
   (f) gimbals mounting the closure within the pressure-vessel head whereby a hermetic seal can be effected by mutual engagement of said sealing surfaces despite misalignments between the reactor and the closure.

2. The improvement of claim 1 wherein the gimbals comprise
   (g) an outer ring, (h) means for mounting the outer ring within the pressure-vessel head for translational movement toward and away from the reactor when the pressure-vessel head is attached, (i) means for biasing the outer ring toward the reactor when the pressure-vessel head is attached, (j) a middle ring, (k) means for mounting the middle ring to the outer ring for pivotal movement about a first axis, (l) an inner ring, which is fixed to the closure, and (m) means for mounting the inner ring to the middle ring for pivotal movement about a second axis, which is orthogonal to the first axis.

3. The improvement of claim 2 wherein the apparatus comprises (n) a plurality of parallel studs extending inwardly from the pressure-vessel head and cooperating with the outer ring so as to guide the outer ring as the outer ring moves toward and away from the reactor when the pressure-vessel head is attached.

4. The improvement of claim 3 wherein the means for biasing the closure comprises (o) a pair of coiled springs piloted in approximate end-to-end relation to each other on each stud, the outer ring being interposed between the nearer ends of the springs piloted on each stud, the farther ends of the springs being blocked so as to bias the outer ring to a neutral position wherein each spring is somewhat compressed when the closure and the pressure-vessel head are detached, whereupon mutual engagement of said sealing surfaces when the closure and the pressure-vessel head are attached displaces the outer ring from the neutral position and causes one of each pair of the springs to be further compressed so as to press said sealing surfaces against each other.

5. The improvement of claim 2 wherein the means for mounting the middle ring to the outer ring enables the middle ring to be adjusted to a selected position along the first axis.

6. The improvement of claim 2 wherein the means for mounting the inner ring in the middle ring enables the inner ring to be adjusted manually to a selected position along the second axis.

7. The improvement of claim 2 wherein the means for mounting the middle ring to the outer ring enables the middle ring to be adjusted manually to a selected position along the first axis and wherein the means for mounting the inner ring to the middle ring enables the inner ring to be adjusted to a selected position along the second axis.

8. The improvement of claim 4 wherein the means for mounting the middle ring to the outer ring enables the middle ring to be adjusted manually to a selected position along the first axis and wherein the means for mounting the inner ring to the middle ring enables the inner ring to be adjusted to a selected position along the second axis.

9. The improvement of any of claims 1 through 8 wherein both of said surfaces are spherical.

10. The improvement of claim 9 wherein the sealing surface of the surrounding margin of the workpiece portal is convex and the sealing surface of the adjoining margin of the closure is concave.

11. The improvement of claim 9 wherein the sealing surface of the surrounding margin of the workpiece portal is concave and the sealing surface of the adjoining margin of the closure is convex.

12. The improvement of any of claims 1 through 8 wherein the apparatus comprises means suspending the reactor within the pressure vessel, at a portion of the reactor near the workpiece portal, so as to relieve mechanical stresses on the reactor, and so as to allow thermal expansion of the reactor and thermal contraction of the reactor.

13. The improvement of claim 12 wherein both of said surfaces are spherical.

14. The improvement of claim 13 wherein the sealing surface of the surrounding margin of the workpiece portal is convex and the sealing surface of the adjoining margin of the closure is concave.

* * * * *

UNITED STATES PATENT OFFICE
CERTIFICATE OF CORRECTION

Patent No. 4,253,417         Dated  March 3, 1981

Inventor(s) Johan A. Valentijn

It is certified that error appears in the above-identified patent and that said Letters Patent are hereby corrected as shown below:

In claim 1, in line 25 of column 12, a comma should be inserted after "high pressures" and before "in controlled atmospheres".

In claim 1, in lines 37 and 38 of column 12, "to the reactor so as to close the workpiece" should be deleted after "close the workpiece" in line 37 and before "portal" in line 38.

Signed and Sealed this

Thirteenth Day of April 1982

[SEAL]

Attest:

Attesting Officer

GERALD J. MOSSINGHOFF

Commissioner of Patents and Trademarks